United States Patent [19]

Arai et al.

[11] Patent Number: 4,927,783
[45] Date of Patent: May 22, 1990

[54] METHOD FOR FABRICATING SEMICONDUCTOR DEVICE

[75] Inventors: Hajime Arai; Hiroshi Harada, both of Hyogo, Japan

[73] Assignee: Mitsubishi Denki Kabushiki Kaisha, Tokyo, Japan

[21] Appl. No.: 180,162

[22] Filed: Apr. 11, 1988

Related U.S. Application Data

[62] Division of Ser. No. 924,566, Oct. 28, 1986, abandoned.

[30] Foreign Application Priority Data

Oct. 29, 1985 [JP] Japan .................................. 60-244551

[51] Int. Cl.$^5$ ...................... H01L 21/24; H01L 21/28
[52] U.S. Cl. .................................. 437/196; 437/199; 437/197; 437/188; 437/248
[58] Field of Search ............... 437/199, 188, 196, 197, 437/199, 228, 247, 248, 973; 420/537; 357/65, 67; 148/DIG. 155

[56] References Cited

U.S. PATENT DOCUMENTS 4,271,424 6/1981 Inayoshi .
4,502,207 3/1985 Ohshima et al. ..................... 437/198
4,538,344 9/1985 Okumura et al. ..................... 29/589
4,546,366 10/1985 Buchanan .
4,584,760 4/1986 Okazawa .............................. 357/67
4,584,767 4/1986 Gregory .

FOREIGN PATENT DOCUMENTS 0097848 10/1986 European Pat. Off. .
2563048 10/1985 France .
0043353 12/1979 Japan ................................. 437/199
0138833 10/1980 Japan ................................. 437/199

OTHER PUBLICATIONS

VLSI Metalization Using Aluminum and its Alloy-Part II, D. Pramanik and A. N. Saxena, Solid State Technology/Mar. 83.

Primary Examiner—Brian E. Hearn
Assistant Examiner—Tuan Nguyen
Attorney, Agent, or Firm—Lowe, Price, LeBlanc, Becker & Shur

[57] ABSTRACT

A semiconductor device in accordance with the present invention comprises: a silicon substrate (1); an insulator layer (2) formed on the silicon substrate; a contact hole (8e) opened through the insulator layer; and a filler of doped silicon (5) grown on the silicon substrate (1) in the contact hole (8e) by solid phase precipitation from an alloy film (6) containing silicon and a doping element.

9 Claims, 3 Drawing Sheets

METHOD FOR FABRICATING SEMICONDUCTOR DEVICE

This application is a division of application Ser. No. 924,566, filed Oct. 28, 1986 now abandoned.

BACKGROUND OF THE INVENTION

1. Field of the Invention

This invention relates to a semiconductor device and more particularly to a contact portion in a semiconductor device.

2. Description of the Prior Art

Referring to FIG. 1, a structure of a conventional contact portion in a semiconductor device is schematically illustrated in a fragmentary sectional view. A method for fabricating this conventional contact portion is as follows. First, an insulator layer 2 is formed on a main surface of a silicon substrate 1 by thermal oxidation, CVD, sputtering or the like, and then a contact hole 8a is opened through the insulator layer 2 by photolithography. Subsequently, a doped layer 4 is formed by ion implantation and thermal diffusion or the like, and then a metal film 3 is deposited by vacuum evaporation, sputtering, CVD or the like. Finally, the metal film 3 is patterned to complete lead wires.

FIG. 2 shows another conventional contact portion which has a contact hole 8b smaller than that of FIG. 1.

FIG. 3 shows a further contact portion according to the prior art, in which a contact hole 8c is tapered by adjusting etching conditions during anisotropic etching.

FIG. 4 shows a still further contact portion according to the prior art, in which a contact hole 8d comprises a first portion 8d₁ formed by isotropic etching and a second portion 8d₂ formed by anisotropic etching.

When the aspect ratio (proportion of the depth to the width) of a contact hole is as small as about 0.5, as in FIG. 1, relatively good coverage of a metal film 3 can be obtained in the contact hole. In the case that Al-Si is deposited as a metal film 3 by sputtering, the thickness of the metal film in the hole reaches 30–40% of that on the top surface of the insulator layer 2. However, when the aspect ratio is about 1.0 as in FIG. 2, the thickness of the metal film in the hole decreases to less than 10% of that on the insulator layer. Accordingly, it is likely that disconnection will occur in the metal wire. In view of this problem, the coverage of the metal film in the hole has been improved in the prior art by providing a taper in the hole as shown in FIG. 3 or by utilizing two-step etching as shown in FIG. 4.

Since a contact portion in a prior art semiconductor device is structured as described above, there exist the following problems.

(I) The contact hole is not filled up, though a flat top surface of the substrate is desired in the technical field of the multilevel interconnection.

(II) The improved contact holes as shown in FIGS. 3 and 4 are relatively large in size and thus are not preferred in view of miniaturization of a semiconductor device.

SUMMARY OF THE INVENTION

In view of the above described problems in the prior art, it is a major object of the present invention to provide a semiconductor device in which a contact hole is filled with a conductive material and is maintained small in size.

A semiconductor device in accordance with the present invention comprises: a silicon substrate; an insulator layer formed on the silicon substrate; a contact hole opened through the insulator layer; and a filler of doped silicon grown on the silicon substrate in the contact hole by solid phase precipitation from an alloy film containing silicon and a doping element.

A method for fabricating a semiconductor device in accordance with the present invention comprises the steps of: preparing a silicon substrate; forming an insulator layer on the silicon substrate; opening a contact hole through the insulator layer; forming an alloy film containing silicon and a doping element, said alloy film being in contact with the silicon substrate at the bottom of the contact hole; and growing a filler of doped silicon on the silicon substrate in the contact hole by solid phase precipitation from the alloy film due to a heat treatment.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 5A to 5D, there are illustrated principal steps in a method for fabricating a semiconductor device according to an embodiment of the present invention.

Figure 1:
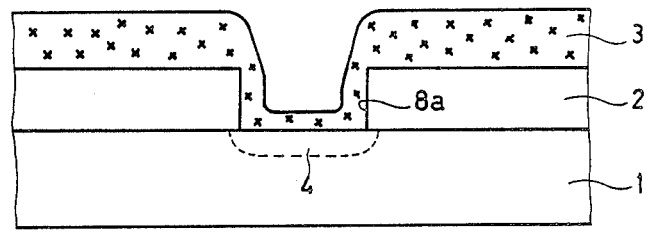
FIGS. 1 to 4 are fragmentary sectional views, showing various structures for a contact portion in a semiconductor device according to the prior art.
Figure 2:
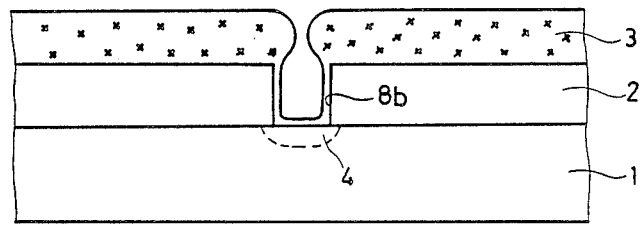
Figure 3:
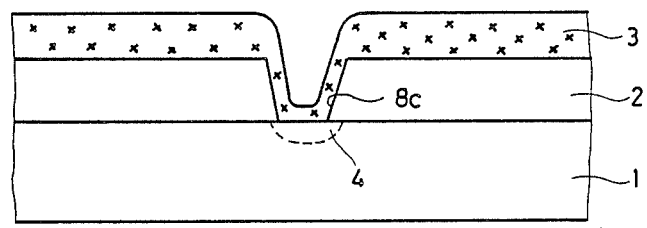
Figure 4:
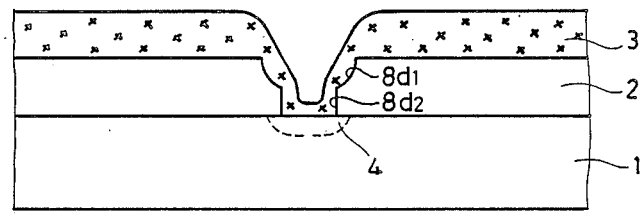
Figure 5A:
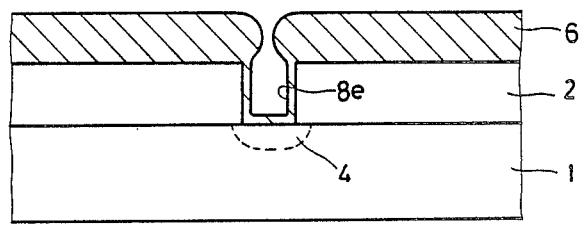
FIGS. 5A to 5D are fragmentary sectional views, illustrating a method for fabricating a contact portion in accordance with the present invention.

A structure shown in FIG. 5A is similar to that shown in FIG. 2, except that an alloy film 6 is formed instead of the metal film 3. This alloy film 6 is of an aluminum alloy containing silicon and a doping element of a p-type such as boron. The Si content of this alloy is much higher than that (1–2%) of an ordinary Al-Si alloy so that Si may readily precipitate.

Figure 5B:
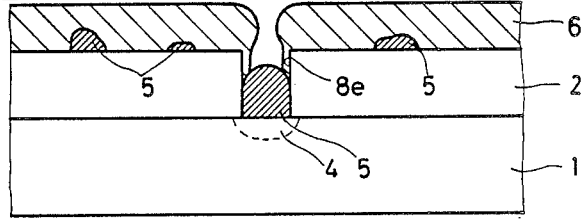

Referring to FIGS. 5A and 5B, when the alloy film 6 is subjected to a heat treatment, the excess silicon is precipitated as silicon particles 5 which contain boron as a doping element. The excess silicon is dominantly precipitated on the silicon substrate 1 in the contact hole 8e by solid phase epitaxial growth. This dominant precipitation by solid phase epitaxial growth is well known. Accordingly, the contact hole 8e is filled with a silicon precipitate 5 which contains boron and is in contact with the silicon substrate 1.

Figure 5C:
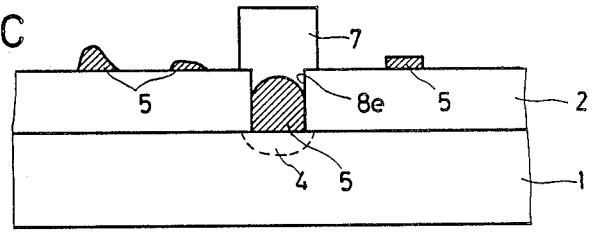

Referring to FIGS. 5B and 5C, the Al-Si alloy film 6 is etched away leaving the silicon precipitate 5 and then a resist layer is provided on the exposed top surface. The resist layer is then patterned so that only the contact hole portion may be covered by the patterned resist 7.

Figure 5D:
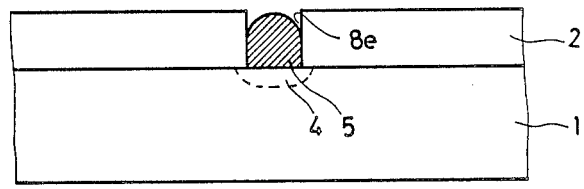

Referring to FIGS. 5C and 5D, the silicon precipitates 5 not covered by the resist 7 are etched away and then the resist 7 is removed.

Figure 6:
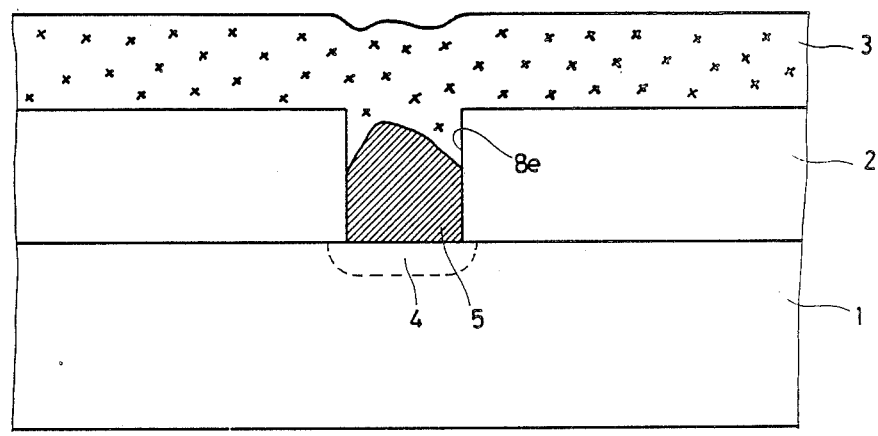
FIG. 6 is a fragmentary sectional view, showing a structure of a contact portion in accordance with the present invention.

Thereafter, as shown in FIG. 6, a metal film 3 is provided to be patterned as lead wires. With the structure as shown in FIG. 6, the following meritorious effects can be obtained.

Since the silicon precipitate 5 fills the contact hole 8e, the coverage of the metal film 3 at the contact hole portion is improved so that the top surface of the metal film 3 is substantially planarized. As a result, the multi-level interconnection can be readily and securely realized.

Further, since the silicon precipitate 5 contains boron, the electric resistance at the contact can be maintain lower enough. Consider the case, for example, that a cylindrical contact hole of 0.8 μm in diameter and 1 μm in thickness is filled with a silicon precipitate 5. Supposing the boron content of $1 \times 10^{19} cm^{-3}$, the specific resistivity of the doped silicon precipitate 5 becomes about $10^{-2} \Omega.cm$ and thus the resistance of the whole silicon precipitate 5 in the contact hole 8e is suppressed to as low as about 20Ω.

On the other hand, the silicon precipitate 5 in the contact hole 8e can be utilized as a resistor by controlling the content of the doping element.

Still further, when aluminum is adopted for the metal film 3, the junction spike of aluminum is prevented by the thick silicon precipitate 5 which covers the silicon substrate 1. Accordingly, it becomes possible to use pure aluminum or an Al-Si alloy containing less silicon as a material for lead wires. Therefore, it is unlikely that silicon is precipitated from the wire material on the doped silicon precipitate 5 during a heat treatment and thus it is quite unlikely that the ohmic contact between the wire and the doped precipitate 5 is deteriorated.

With the structure shown in FIG. 6, the contact hole can be minimized to miniaturize a semiconductor device.

Although boron as a p-type doping element is contained in the Al-Si alloy film 6 in the above described embodiment, it will be understood that phosphorus or arsenic as an n-type doping element may be contained in the Al-Si alloy film 6 to make a contact with an n-type doped layer on a silicon substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a semiconductor device, comprising the steps of:
   forming an insulator layer on a silicon substrate;
   opening a contact hole through said insulator layer;
   forming an alloy film containing silicon, said alloy film being in contact with said silicon substrate at the bottom of said contact hole;
   growing a filler of doped silicon at least on said silicon substrate in said contact hole by solid phase precipitation from said alloy film by heat treatment;
   etching said alloy film away to leave at least said filler on said substrate in said contact hole; and
   forming a conductor layer on said insulator layer, said conductor layer being in electric contact with said filler.

2. The method for fabricating a semiconductor device in accordance with claim 1, wherein said alloy film is of an Al-Si alloy.

3. The method for fabricating a semiconductor device in accordance with claim 1, wherein said doping element is selected from boron, phosphorus and arsenic.

4. The method for fabricating a semiconductor device in accordance with claim 3, wherein
   the doping element is boron.

5. The method for fabricating a semiconductor device in accordance with claim 2, wherein
   the Si is present in said alloy in an amount higher by about 1-2% than an ordinary Al-Si alloy to permit the ready precipitation of Si.

6. A method for fabricating a semiconductor device, comprising the steps of:
   preparing a silicon substrate;
   forming an insulator layer on said silicon substrate;
   opening a contact hole through said insulator layer;
   forming an alloy film containing silicon and a doping element, said alloy film being in contact with said silicon substrate at the bottom of said contact hole, and
   growing a filler of doped silicon on said silicon substrate in said contact hole by solid phase precipitation from said alloy film by heat treatment; further comprising
   etching said alloy film away to expose said doped silicon filler on said silicon substrate; and
   providing a resist layer covering the surface of said doped silicon filler to cover at least said contact hole and portions of said insulator layer.

7. The method for fabricating a semiconductor device in accordance with claim 6, further comprising
   etching away said doped silicon filler formed on said insulator layer; and
   removing said resist layer.

8. The method for fabricating a semiconductor device of claim 7, further comprising
   providing a metal film on said insulator layer and said doped silicon filler in said contact hole.

9. The method for fabricating a semiconductor device of claim 8, further comprising
   substantially planarizing the outer surface of said metal film.

* * * * *